(12) United States Patent
Lin et al.

(10) Patent No.: US 10,128,206 B2
(45) Date of Patent: Nov. 13, 2018

(54) CONDUCTIVE PILLAR STRUCTURE

(75) Inventors: Chih-Wei Lin, Xinfeng Township (TW); Ming-Da Cheng, Jhubei (TW); Wen-Hsiung Lu, Jhonghe (TW); Meng-Wei Chou, Zhubei (TW); Hung-Jui Kuo, Hsinchu (TW); Chung-Shi Liu, Shin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 897 days.

(21) Appl. No.: 12/904,506

(22) Filed: Oct. 14, 2010

(65) Prior Publication Data
US 2012/0091574 A1   Apr. 19, 2012

(51) Int. Cl.
*H01L 21/768*   (2006.01)
*H01L 23/48*   (2006.01)
*H01L 23/00*   (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 2224/0341* (2013.01); *H01L 2224/0345* (2013.01); *H01L 2224/0361* (2013.01); *H01L 2224/03452* (2013.01); *H01L 2224/03462* (2013.01); *H01L 2224/03464* (2013.01); *H01L 2224/03912* (2013.01); *H01L 2224/0401* (2013.01); *H01L 2224/04042* (2013.01); *H01L 2224/05073* (2013.01); *H01L 2224/05166* (2013.01); *H01L 2224/05181* (2013.01); *H01L 2224/05187* (2013.01); *H01L 2224/05559* (2013.01); *H01L 2224/05564* (2013.01); *H01L 2224/05647* (2013.01); *H01L 2224/1132* (2013.01); *H01L 2224/1145* (2013.01); *H01L 2224/11452* (2013.01); *H01L 2224/11462* (2013.01); *H01L 2224/11464* (2013.01); *H01L 2224/11472* (2013.01); *H01L 2224/13006* (2013.01); *H01L 2224/13017* (2013.01);
(Continued)

(58) Field of Classification Search
CPC . H01L 2224/05022; H01L 2224/05023; H01L 2224/05026; H01L 2224/05027; H01L 2224/05567; H01L 2224/05568; H01L 2224/05572
USPC ........................................................ 257/737
See application file for complete search history.

(56) References Cited

U.S. PATENT DOCUMENTS 6,417,089 B1 * 7/2002 Kim et al. ..................... 438/612
2004/0180296 A1 * 9/2004 Chen et al. .................... 430/315
(Continued)

OTHER PUBLICATIONS

SIPO Office Action dated Apr. 2, 2013 from corresponding application No. CN 201110092051.8.
(Continued)

*Primary Examiner* — Raj R Gupta
(74) *Attorney, Agent, or Firm* — Hauptman Ham, LLP

(57) ABSTRACT

The invention relates to a bump structure of a semiconductor device. An exemplary structure for a semiconductor device comprises a substrate; a contact pad over the substrate; a passivation layer extending over the substrate having an opening over the contact pad; and a conductive pillar over the opening of the passivation layer, wherein the conductive pillar comprises an upper portion substantially perpendicular to a surface of the substrate and a lower portion having tapered sidewalls.

20 Claims, 10 Drawing Sheets

(52) U.S. Cl.
CPC ............. *H01L 2224/13023* (2013.01); *H01L 2224/13147* (2013.01); *H01L 2224/16* (2013.01); *H01L 2224/48* (2013.01); *H01L 2924/00014* (2013.01); *H01L 2924/0103* (2013.01); *H01L 2924/014* (2013.01); *H01L 2924/0104* (2013.01); *H01L 2924/0105* (2013.01); *H01L 2924/01006* (2013.01); *H01L 2924/01012* (2013.01); *H01L 2924/01013* (2013.01); *H01L 2924/01019* (2013.01); *H01L 2924/01024* (2013.01); *H01L 2924/01029* (2013.01); *H01L 2924/01033* (2013.01); *H01L 2924/01038* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/1305* (2013.01); *H01L 2924/1306* (2013.01); *H01L 2924/14* (2013.01)

(56) References Cited

U.S. PATENT DOCUMENTS

| | | | |
|---|---|---|---|
| 2005/0239277 A1* | 10/2005 | Mercer et al. | 438/614 |
| 2006/0105560 A1 | 5/2006 | Tseng et al. | |
| 2008/0157060 A1* | 7/2008 | Brar et al. | 257/20 |
| 2008/0169562 A1 | 7/2008 | Ke et al. | |
| 2009/0057893 A1* | 3/2009 | Iwaki | 257/737 |
| 2010/0052162 A1* | 3/2010 | Iijima | 257/737 |
| 2010/0133688 A1 | 6/2010 | Shigihara et al. | |
| 2010/0197132 A1* | 8/2010 | Ahn et al. | 438/618 |
| 2011/0115074 A1* | 5/2011 | Hu et al. | 257/737 |

OTHER PUBLICATIONS

Office Action dated Feb. 19, 2014 from corresponding application No. TW 100107052.

* cited by examiner

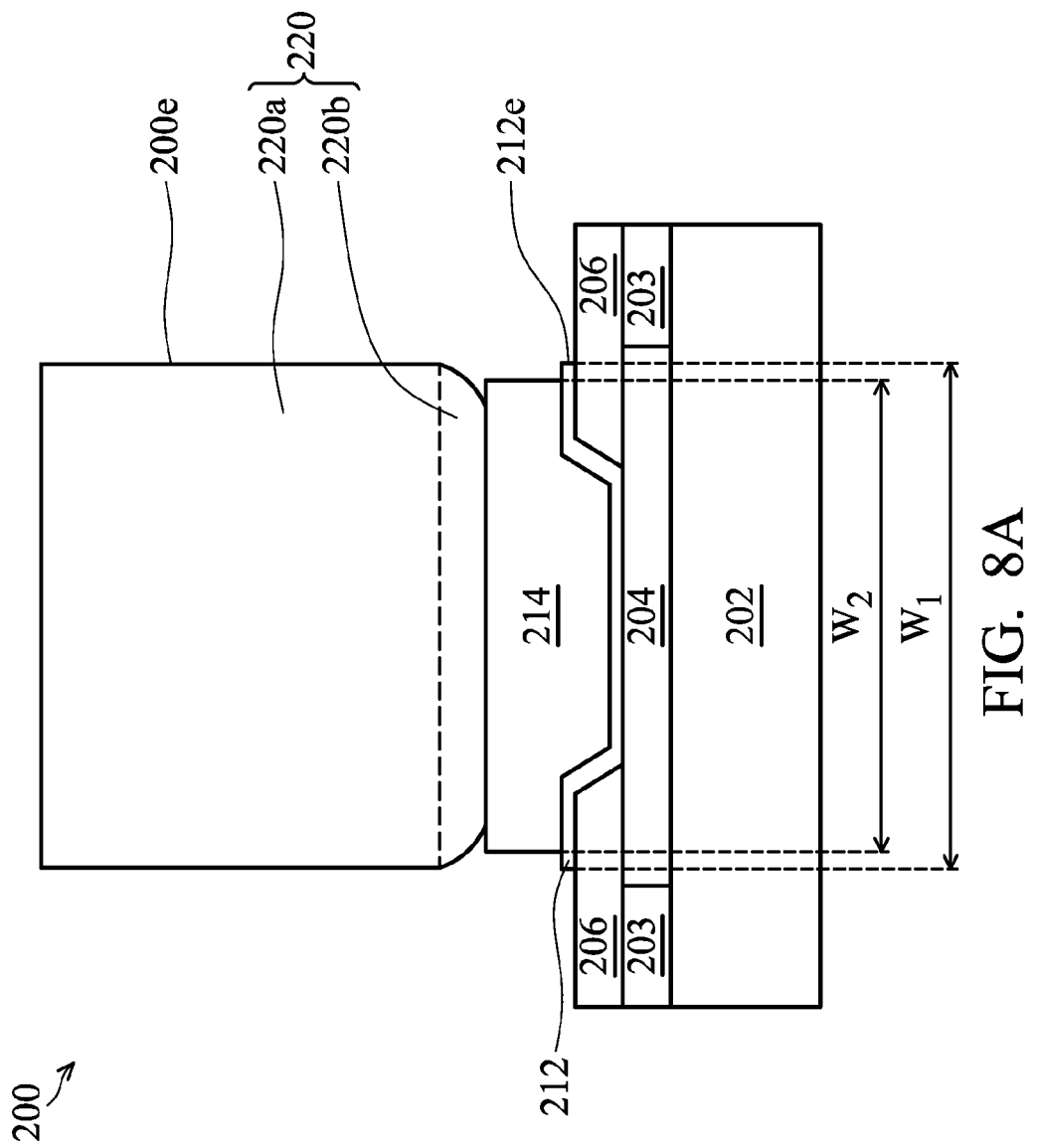

CONDUCTIVE PILLAR STRUCTURE

FIELD OF THE INVENTION

The invention relates to integrated circuit fabrication, and more particularly to a conductive pillar with an undercut structure.

BACKGROUND

Modern integrated circuits (ICs) are made up of literally millions of active devices, such as diodes and transistors, and passive devices, such as inductors, capacitors and resistors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern ICs. On top of the interconnect structures, bond pads are formed on the interconnect structures and exposed on the top surface of the respective chip for an IC package. Electrical connections are made through bond pads to connect the chip to a package substrate or another die. Bond pads can be used for wire bonding or flip-chip bonding during IC packaging.

Flip-chip bonding utilizes bumps to establish electrical contact between a chip's bond pads and the package substrate. Structurally, a bump actually contains the bump itself and a so-called under bump metallurgy (UBM) layer located between the bump and a bond pad. An UBM layer generally comprises a diffusion barrier layer (or a glue layer) and a seed layer, arranged in that order, on the bond pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by a copper pillar bump, which achieves finer pitch with minimum probability of bump bridging, reduces the capacitance load for the circuits, and allows the electronic component to perform at higher frequencies.

However, there are challenges to implementing such features and processes in IC fabrication. For example, delamination from edge portion of the copper pillar and UBM layer may occur due to high stress concentration. Accordingly, what is needed is an improved bump structure and method of bump formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-8B show schematic cross-sectional views of a conductive pillar of a semiconductor device at various stages of fabrication according to various aspects of the present disclosure.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Figure 1:
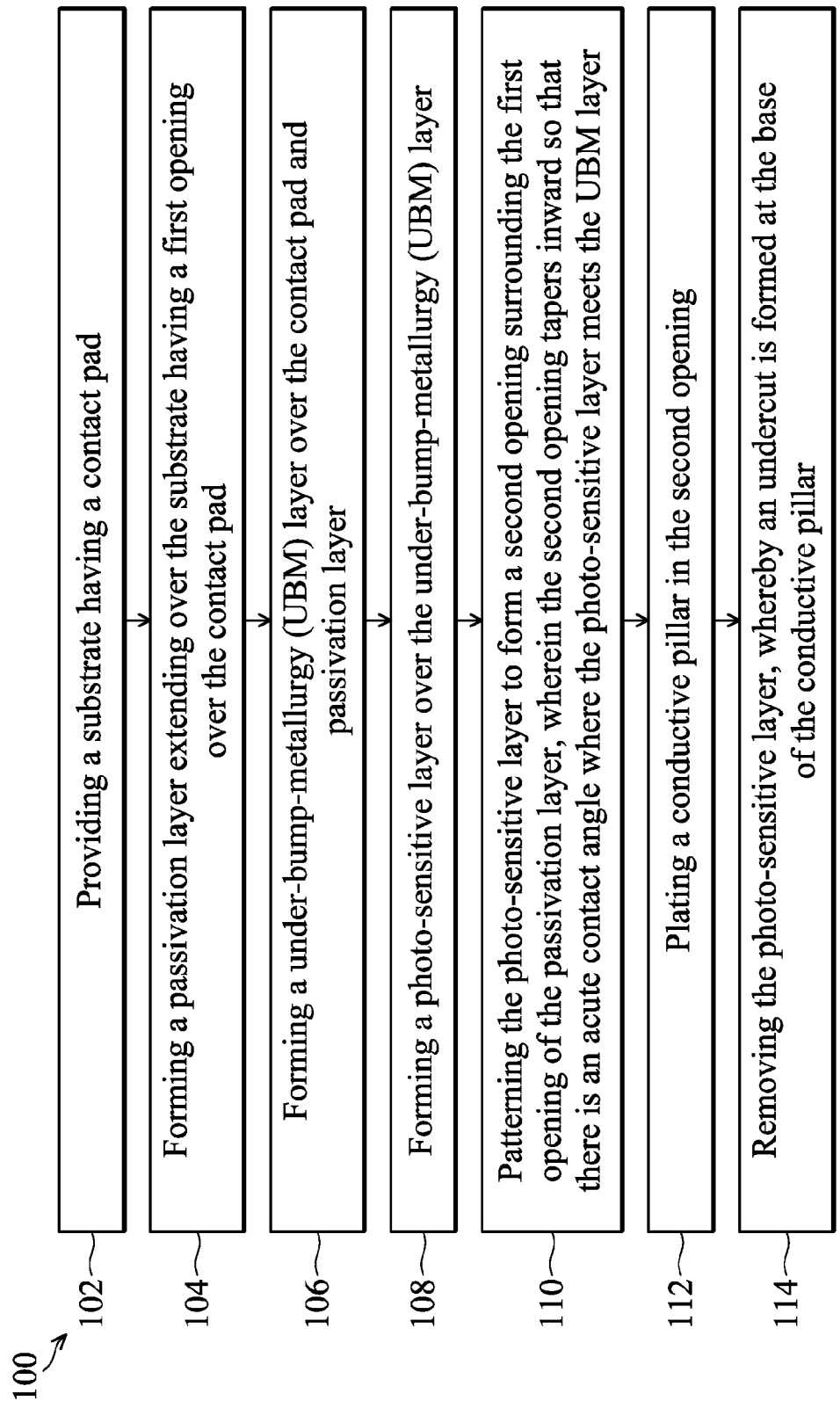
FIG. 1 is a flowchart illustrating a method for fabricating a semiconductor device comprising a conductive pillar according to various aspects of the present disclosure.

FIG. 1 is a flowchart illustrating a method 100 for fabricating a semiconductor device 200 comprising a conductive pillar 220 (shown in FIGS. 5 through 8B) according to various aspects of the present disclosure. FIGS. 2-8B show schematic cross-sectional views of a semiconductor device 200 at various stages of fabrication according to various aspects of the present disclosure. The method of FIG. 1 does not produce a completed semiconductor device. Accordingly, it is understood that additional processes may be provided before, during, and after the method 100 of FIG. 1, and that some other processes may only be briefly described herein. Also, FIGS. 2 through 8B are simplified for a better understanding of the inventive concepts of the present disclosure. For example, although the figures illustrate the conductive pillar 220 of a semiconductor device 200, it is understood the semiconductor device 200 may be part of an IC package that further comprises a number of other components such as under-fill, lead-frame, etc.

Figure 2:
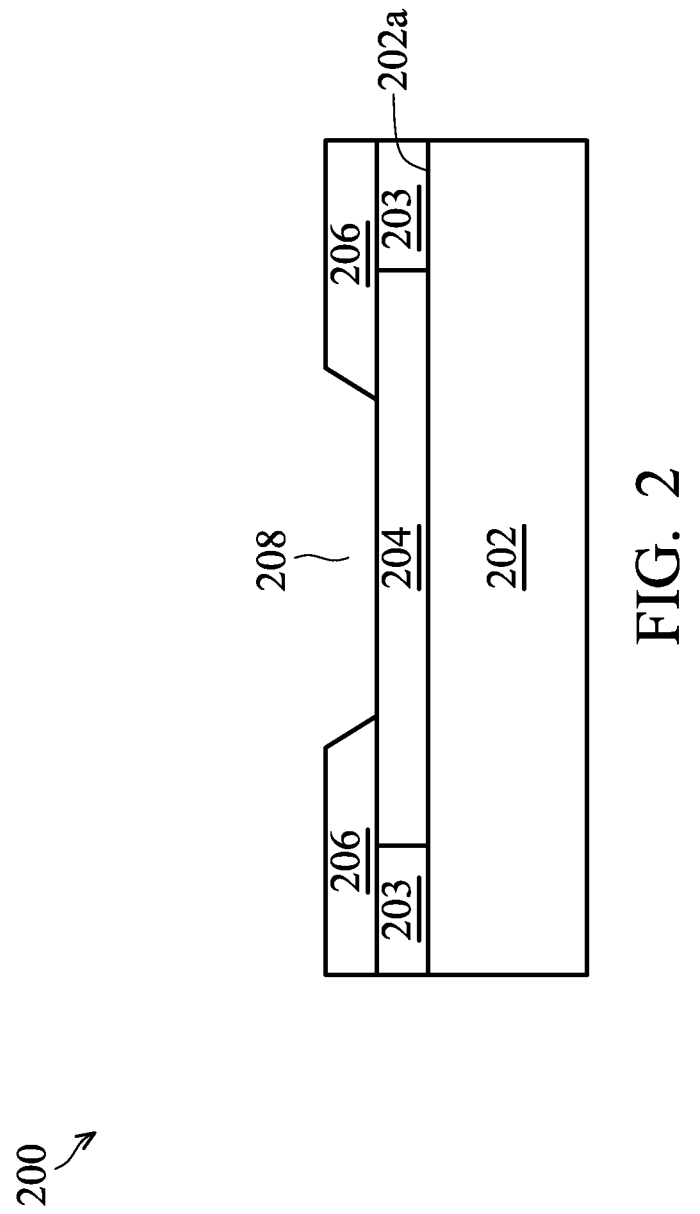

Referring to FIGS. 1 and 2, the method 100 begins at step 102 wherein a substrate 202 having a contact pad 204 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxial layer. Furthermore, the substrate 202 may be a semiconductor on insulator such as silicon on insulator (SOI) or silicon on sapphire. In other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure. The substrate 202 comprises a surface 202a.

The substrate 202 further comprises a plurality of isolation regions (not shown). The isolation regions may utilize isolation technology, such as local oxidation of silicon (LOCOS) or shallow trench isolation (STI), to define and electrically isolate the various microelectronic elements (not shown). In the present embodiment, the isolation regions includes a STI. The isolation regions may comprise silicon oxide, silicon nitride, silicon oxynitride, fluoride-doped silicate glass (FSG), a low-K dielectric material, other suitable materials, and/or combinations thereof. The isolation regions, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Examples of the various microelectronic elements that may be formed in the substrate 202 include transistors (e.g., p-channel/n-channel metal oxide semiconductor field effect transistors (pMOSFETs/nMOSFETs), bipolar junction transistors (BJTs), high voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices.

The substrate 202 further comprises inter-layer dielectric (ILD) layers, inter-metal dielectric (IMD) layers and a metallization structure overlying the integrated circuits. The IMD layers in the metallization structure include low-k dielectric materials, un-doped silicate glass (USG), fluorine-doped silicate glass (FSG), carbon-doped silicate glass, silicon nitride, silicon oxynitride, or other commonly used materials. The dielectric constants (k value) of the low-k dielectric materials may be less than about 3.9, or less than about 2.3. Metal lines in the metallization structure may be formed of copper or copper alloys by a suitable formation method.

A contact pad 204 is a top metallization layer formed in a top-level IMD layer 203. Contact pad 204 is a portion of conductive routes and has an exposed surface treated by a planarization process, such as chemical mechanical polishing (CMP), if necessary. Suitable materials for the contact pad 204 may comprise, but are not limited to, for example copper (Cu), aluminum (Al), AlCu, copper alloy, or other conductive materials. The contact pad 204 is used in the bonding process to connect the integrated circuits in the respective chip to external features.

The method 100 in FIG. 1 continues with step 104 in which the structure in FIG. 2 is produced by forming a passivation layer 206 extending over the substrate 202 having a first opening 208 over the contact pad 204. The passivation layer 206 is formed overlying and exposing a portion of the contact pad 204 for allowing subsequent conductive pillar bump processes. The passivation layer 206 is formed of a non-organic material selected from un-doped silicate glass (USG), silicon nitride, silicon oxynitride, silicon oxide, and combinations thereof. Alternatively, the passivation layer is formed of a polymer layer, such as an epoxy, polyimide, benzocyclobutene (BCB), polybenzoxazole (PBO), and the like, although other relatively soft, often organic, dielectric materials can also be used. In one embodiment, the passivation layer 206 may be formed using a chemical vapor deposition (CVD), high density plasma CVD (HDP CVD), sub-atmospheric CVD (SACVD), physical vapor deposition (PVD), or spin-on process.

Figure 3:
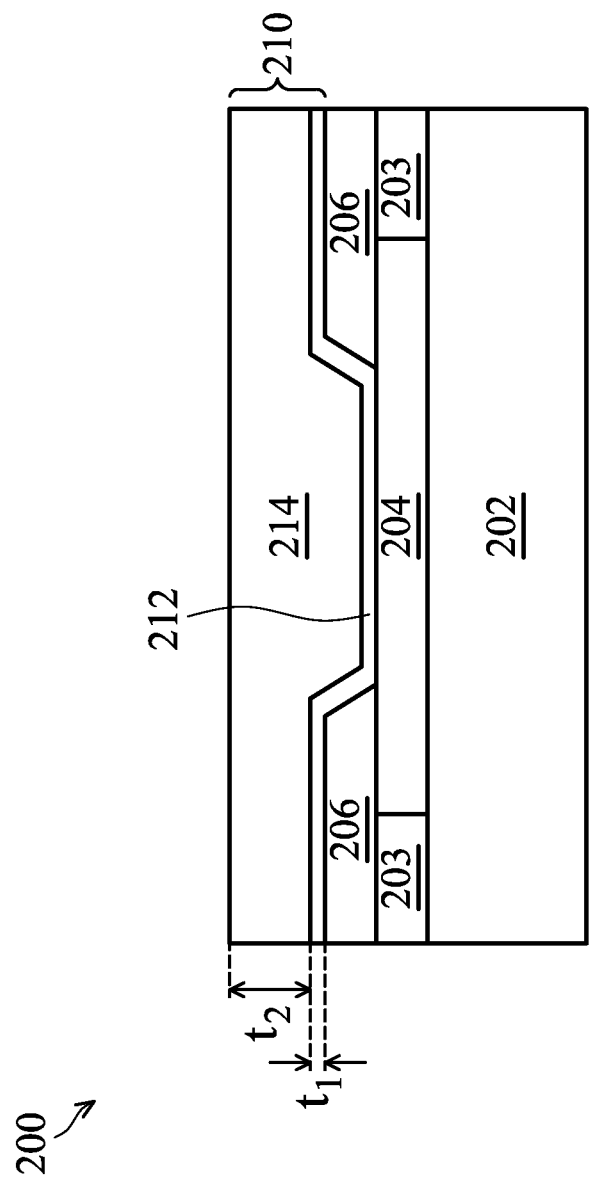

The method 100 in FIG. 1 continues with step 106 in which the structure in FIG. 3 is produced by forming an under-bump-metallurgy (UBM) layer 210 over the contact pad 204 and passivation layer 206. Any standard under-bump-metallurgy (UBM) material may be employed in embodiments of the invention. In the present embodiment, the under-bump-metallurgy (UBM) layer 210 comprises a first under-bump-metallurgy (UBM) sub-layer 212 and a second under-bump-metallurgy (UBM) sub-layer 214 over the first under-bump-metallurgy (UBM) sub-layer 212.

For example, the first UBM sub-layer 212 is formed on the exposed portion of the bond pad 204, and extends to a portion of the passivation layer 206. The first UBM sub-layer 212, also referred to as a diffusion barrier layer or a glue layer, is formed of titanium, tantalum, titanium nitride, tantalum nitride, or the like by PVD or sputtering. The first UBM sub-layer 212 is deposited to a thickness $t_1$ of between about 500 and 1200 angstroms. In one embodiment, the second UBM sub-layer 214, also referred to as a seed layer, is formed of copper by PVD or sputtering. In another embodiment, the second UBM sub-layer 214 may be formed of copper alloys that comprise silver, chromium, nickel, tin, gold, and combinations thereof. The second UBM sub-layer 214 is deposited to a thickness $t_2$ of between about 4000 and 6000 angstroms. A ratio of the thickness $t_1$ of the first under-bump-metallurgy (UBM) sub-layer to the thickness $t_2$ of the second under-bump-metallurgy (UBM) sub-layer is from about 0.15 to 0.25.

The method 100 in FIG. 1 continues with step 108 in which a photo-sensitive layer 216 is formed over the UBM layer 210. The photo-sensitive layer 216 may be a dry film or a photo-resist film. The photo-sensitive layer 216 may be applied over the UBM layer 210 by suitable deposition processes. In one embodiment, the photo-sensitive layer 216 is formed by laminating a dry film over the UBM layer 210 having a thickness of from about 50 μm to about 120 μm. In another embodiment, the photo-sensitive layer 216 is formed by spin-coating a photo-resist film over the UBM layer 210 to obtain a thickness of from about 50 μm to about 120 μm. It is understood that the thickness of the photo-sensitive layer 216 can be controlled and selected to be a desirable value, this especially in relation to the thickness of the column of a to-be-formed conductive pillar bump material.

Figure 4:
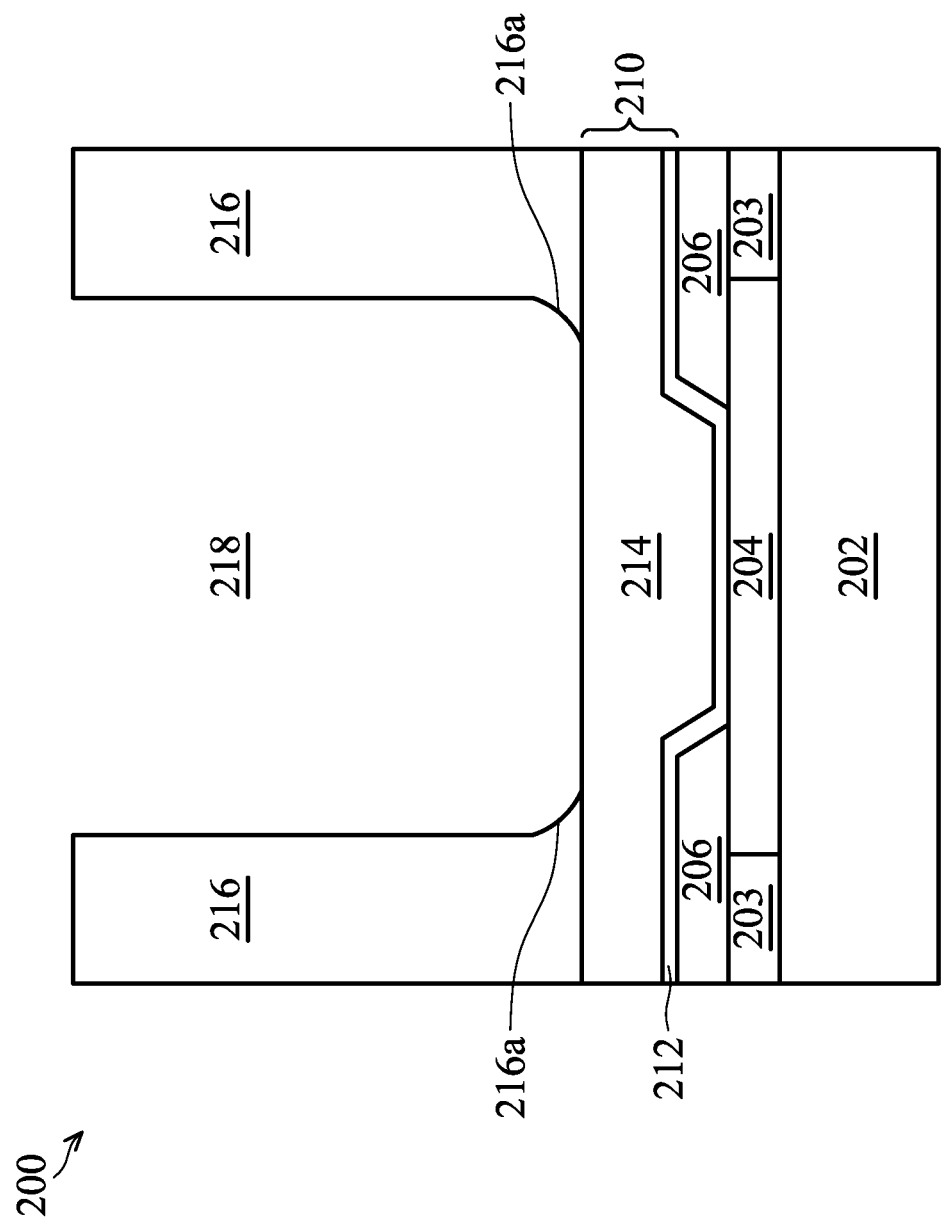

The method 100 in FIG. 1 continues with step 110 in which the structure in FIG. 4 is produced by patterning the photo-sensitive layer 216 to form a second opening 218 surrounding the first opening 208 of the passivation layer 206, wherein the second opening 218 tapers inward so that photo-sensitive layer 216 forms an acute angle where the tapered portion of photo-sensitive layer 216 contacts the UBM layer 210. The tapered structure is formed by under-exposing or under-developing the photo-sensitive layer 216, thereby the second opening 218 tapers inward so that there is an acute angle (of layer 216) where the photo-sensitive layer 216 meets the UBM layer 210. There are footing portions 216a formed at the lower portion of the second openings 218. In the present embodiment, the photo-sensitive layer 216 is patterned by suitable processes to form the second opening 218 surrounding the first opening 208 of the passivation layer 206. The second opening 218 exposes a portion of the UBM layer 210 for defining a window of a conductive pillar 220 (shown in FIGS. 5 through 8B).

It should be noted that constructing a conductive pillar 220 with a larger volume provides higher mechanical strength and lower resistance for flip-chip bonding. Because the volume of the conductive pillar 220 is a function of the thickness and cross-section area of the conductive pillar 220, the photo-sensitive layer 216 is required to have a thickness thick enough for forming a conductive pillar 220, and the second opening 218 is thus wider than the first opening 208 of the passivation layer 206, thereby providing a larger cross-sectional area to accommodate a conductive pillar 220 with a larger volume.

Figure 5:
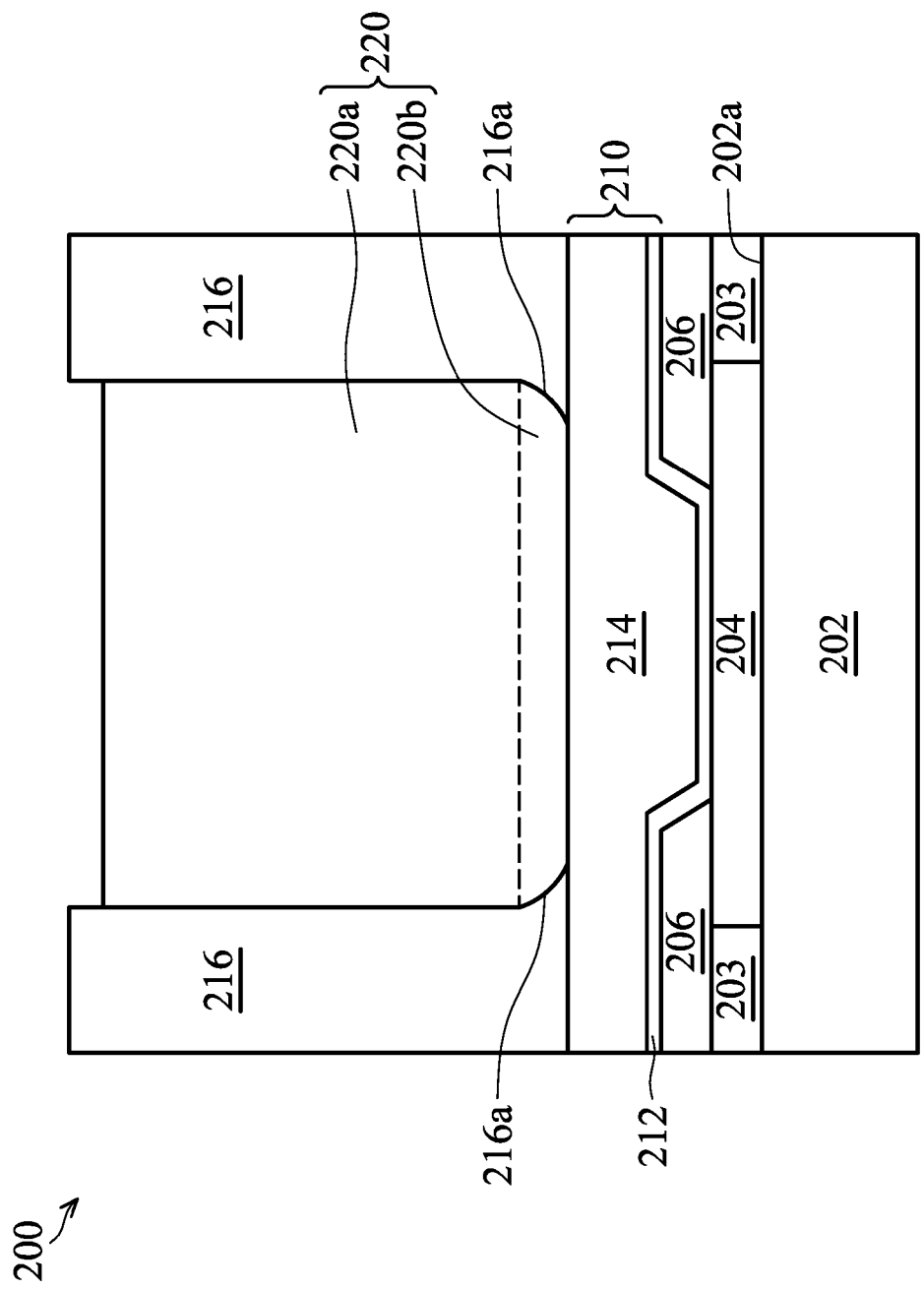

The method 100 in FIG. 1 continues with step 112 in which the structure in FIG. 5 is produced by plating a conductive pillar 220 in the second opening 218. In the present embodiment, the second opening 218 is partially or fully filled with a conductive pillar 220 also formed on the footing portions 216a of the photo-sensitive layer 216 by suitable formations methods. In the present embodiment, the conductive pillar 220 is formed upward along the second opening 218 using the underlying UBM layer 210 as a seed layer. It should be noted that there are footing portions 216a formed at the lower portion of the second opening 218, so that the conductive pillar 220 is not formed with a uniform width and will have an undercut structure at the base of the conductive pillar 220, i.e., the conductive pillar 220 comprise an upper portion 220a substantially perpendicular to a surface 202a of the substrate 202 and a lower portion 220b having tapered sidewalls.

The conductive pillar 220 comprises a copper layer, also referred as a copper layer 220. The copper layer 220 is intended to comprise substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The conductive pillar 220 and the second under-bump-metallurgy (UBM) layer 214 may comprise the same material. The formation methods may include sputtering, printing, electro plating, electroless plating, and chemical vapor deposition (CVD) methods. For example, electro-chemical plating (ECP) is carried out to form the Cu layer 220. In an exemplary embodiment, the thickness of the Cu layer 220 is greater than 25 μm. In another exemplary embodiment, the thickness of the Cu layer 220 is greater than 40 μm. For example, the Cu layer 220 is of about 40-60 μm thickness, or about 60-120 μm thickness, although the thickness may be greater or smaller.

Figure 6:
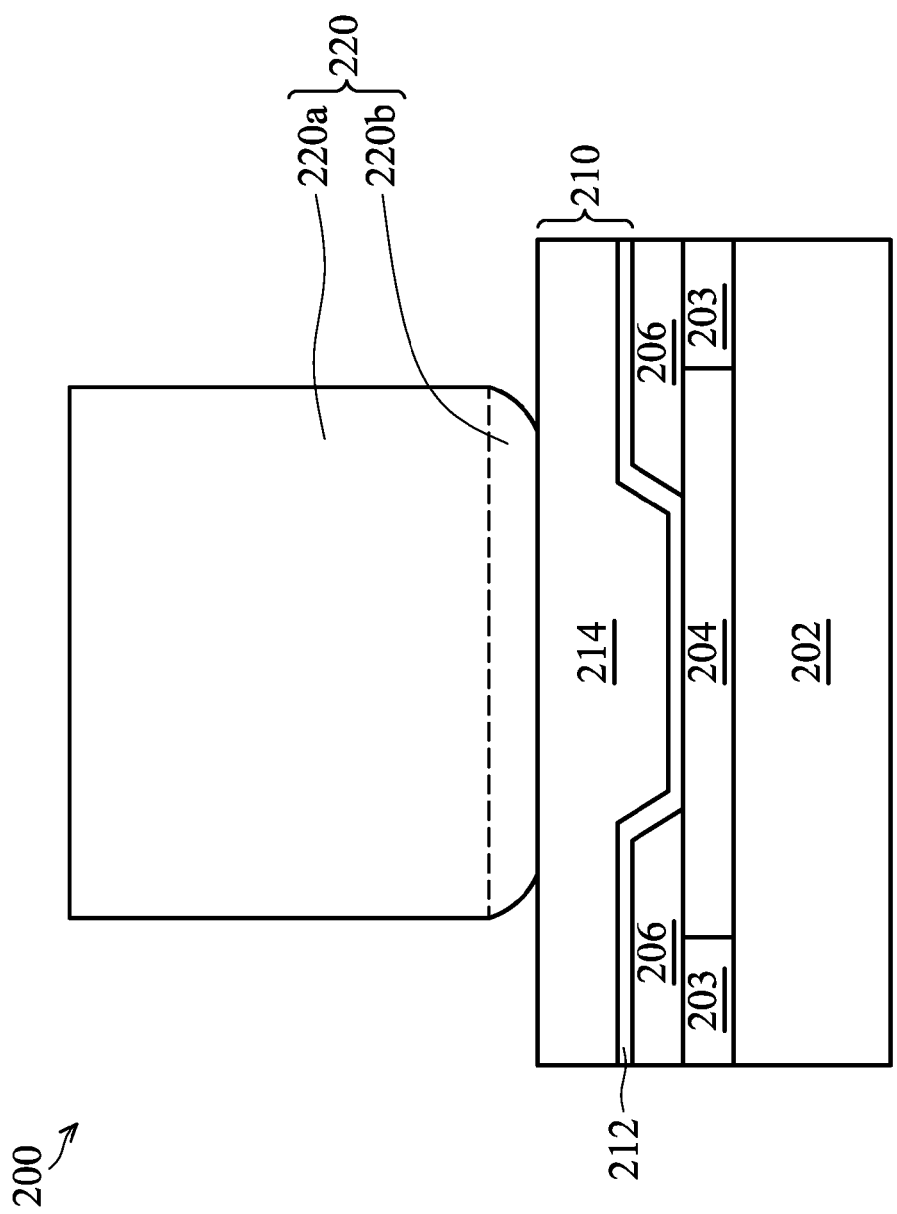

The method 100 in FIG. 1 continues with step 114 in which the structure in FIG. 6 is produced by removing the photo-sensitive layer 216, whereby an undercut is formed at the base of the conductive pillar 220. In the present embodiment, the photo-sensitive layer 216 may be removed using conventional wet etching or dry etching processes.

Figure 7A:
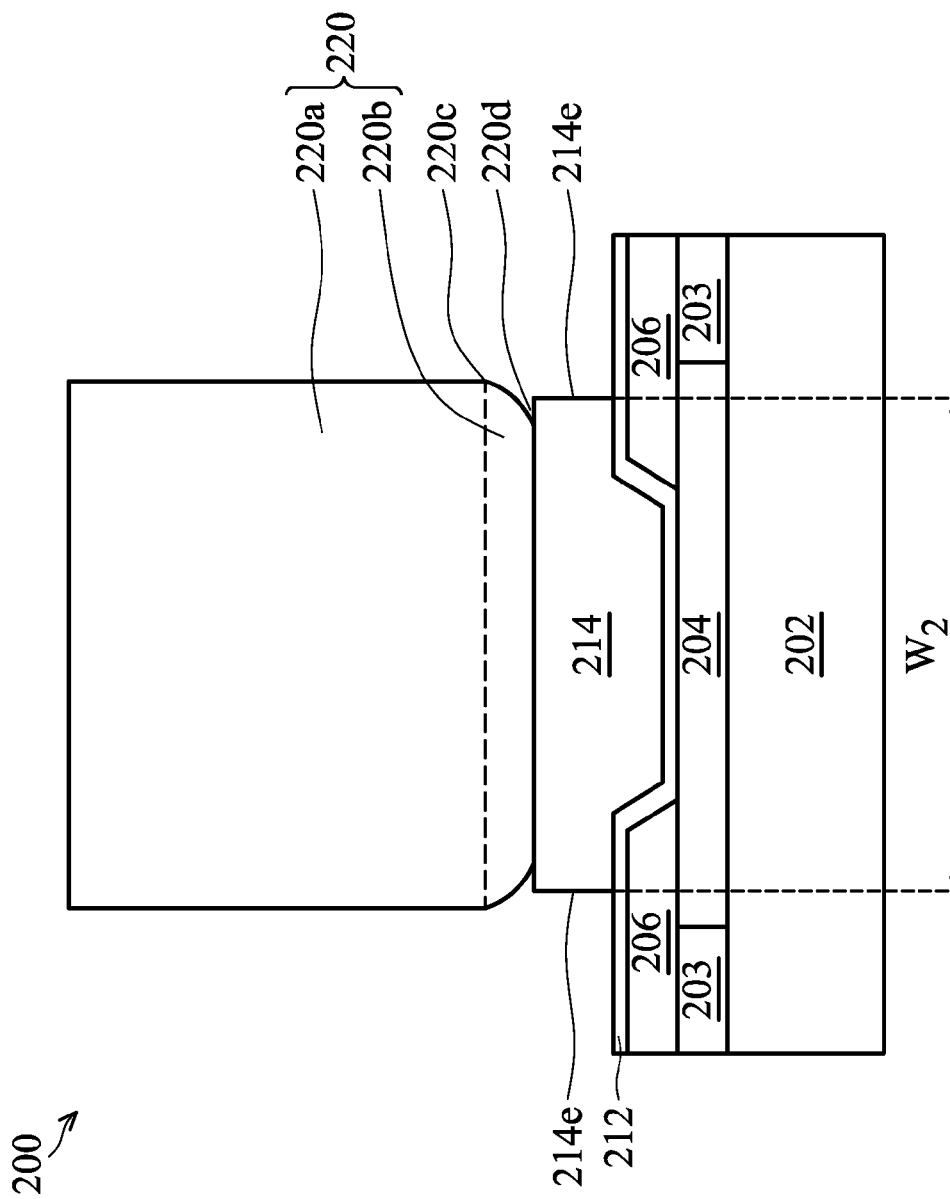
Figure 7B:
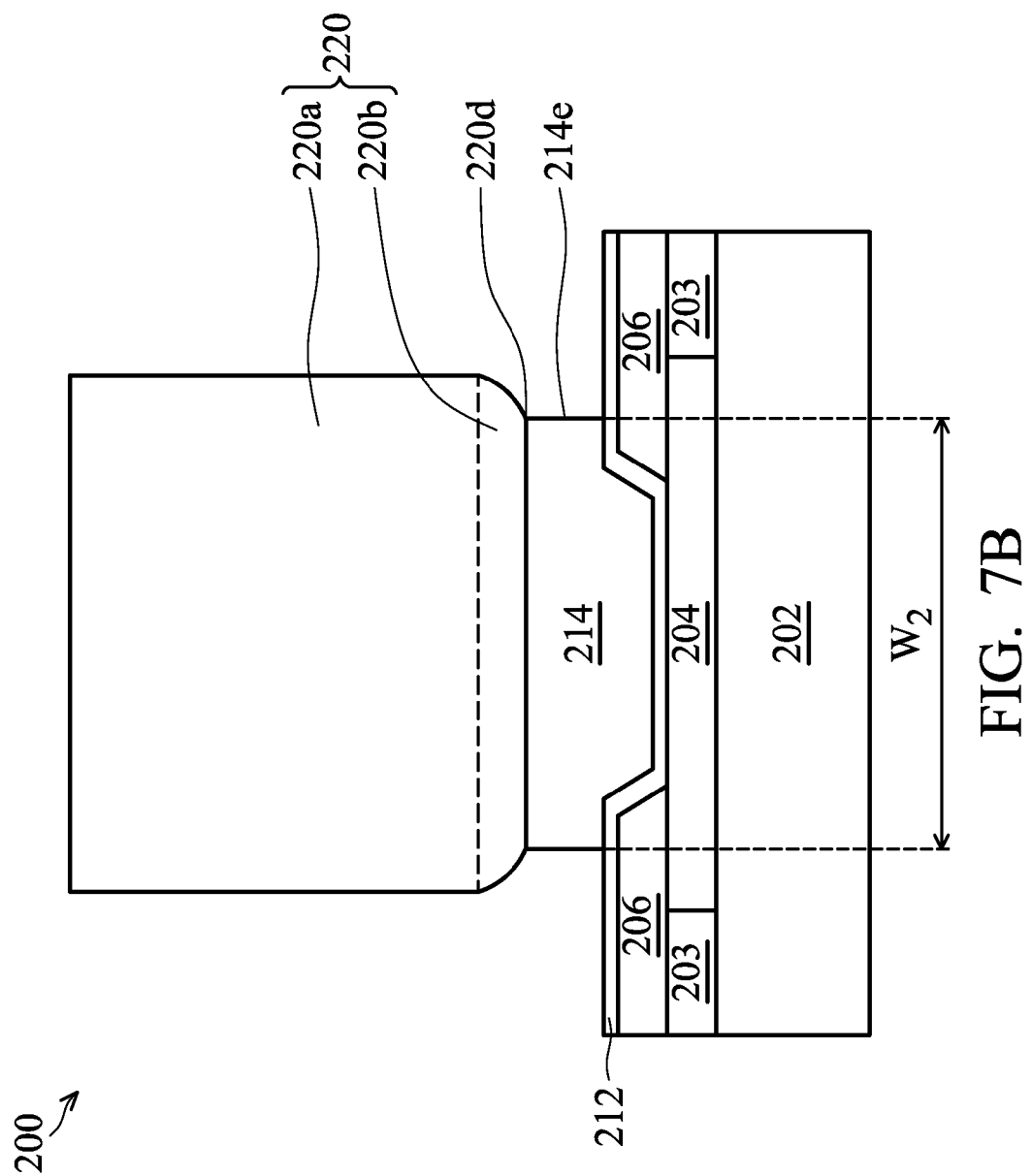

FIGS. 7A and 7B show the substrate 202 of FIG. 6 after a portion of the second under-bump-metallurgy (UBM) sub-layer 214 is removed to expose the first under-bump-metallurgy (UBM) sub-layer 212. The step of removing a portion of the second under-bump-metallurgy (UBM) sub-layer 214 is performed using a wet etching process. For example, the wet etching process comprises removing a portion of the second under-bump-metallurgy (UBM) sub-layer 214 in a solution comprising $H_3PO_3$ and $H_2O_2$.

In the present embodiment, the second under-bump-metallurgy (UBM) sub-layer 214 has a second width $W_2$ over the first under-bump-metallurgy (UBM) sub-layer 212. In one embodiment, an outer edge 214e of the second under-bump-metallurgy (UBM) sub-layer 214 is between an outer edge 220c of the lower portion 220b of the conductive pillar 220 and an inner edge 220d of the lower portion 220b of the conductive pillar 220 (shown in FIG. 7A). In another embodiment, the second under-bump-metallurgy (UBM) sub-layer 214 may be further removed until the outer edge 214e of the second under-bump-metallurgy (UBM) sub-layer 214 is substantially aligned with the inner edge 220d of the lower portion 220b of the conductive pillar 220 (shown in FIG. 7B). It should be noted that additional etching is not allowable due to increased contact resistance, resulting from the reduced contact area between the second under-bump-metallurgy (UBM) sub-layer 214 and conductive pillar 220.

Figure 8B:
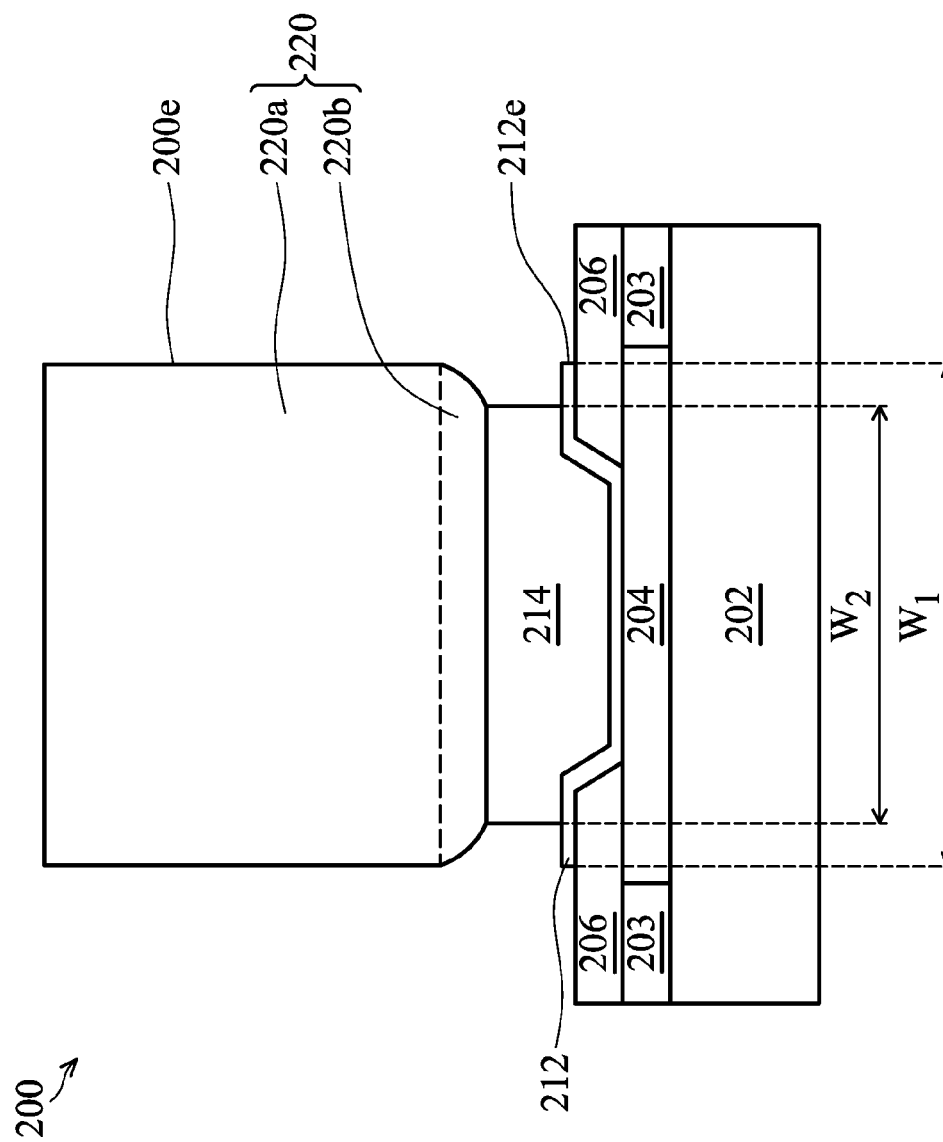

Then, using the conductive pillar 220 as a hard-mask, FIGS. 8A and 8B show the substrate 202 of FIGS. 7A and 7B after a portion of the first under-bump-metallurgy (UBM) sub-layer 212 is removed to expose the passivation layer 206. The step of removing a portion of the first under-bump-metallurgy (UBM) sub-layer 212 is performed using a dry etching process. For example, the step of the dry etching process is performed under a power of about 200 to 600 W and a pressure of about 5 to 25 mTorr, using $CHF_3$ and $CF_4$ as etching gases.

Thus, the upper portion 220a of the conductive pillar 220 has an outer edge 220e substantially aligned with an outer edge 212e of the first under-bump-metallurgy (UBM) sub-layer 212. In the present embodiment, the first under-bump-metallurgy (UBM) sub-layer 212 has a first width $W_1$. The first width $W_1$ is in the range of about 60 to 100 μm. In the present embodiment, the second width $W_2$ is less than the first width $W_1$. In one embodiment, a difference between the first width $W_1$ and second width $W_2$ is in the range of about 0.5 to 10 μm. In one embodiment, a ratio of the first width to the second width is from about 1.01 to 1.20.

Therefore, the semiconductor device 200 comprises a substrate 202; a contact pad 204 over the substrate 202; a passivation layer 206 extending over the substrate 202 having an opening 208 over the contact pad 204; a conductive pillar 220 over the opening 208 of the passivation layer 206, wherein the conductive pillar 220 comprises an upper portion 220a substantially perpendicular to a surface 202a of the substrate 202 and a lower portion 220b having tapered sidewalls, a under-bump-metallurgy (UBM) layer 210 between the contact pad 204 and conductive pillar 220, wherein the under-bump-metallurgy (UBM) layer 210 comprises a first under-bump-metallurgy (UBM) sub-layer 212 having a first width $W_1$ over the contact pad 204; and a second under-bump-metallurgy (UBM) sub-layer 214 having a second width $W_2$ over the first under-bump-metallurgy (UBM) sub-layer 212, wherein the second width $W_2$ is less than the first width $W_1$. Then, subsequent processes, including flip-chip processing, must be performed after forming the semiconductor device 200 to complete the IC fabrication.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a conductive pillar for a semiconductor device. In this way, a delamination-free bump structure for a semiconductor device may be formed.

What is claimed is:

1. A semiconductor device comprising:
   a substrate;
   a contact pad over the substrate;
   a passivation layer extending over the substrate and having an opening over the contact pad;
   an under-bump metallurgy (UBM) layer over the contact pad; and
   a conductive pillar over the opening of the passivation layer, wherein a bottom-most surface of the conductive pillar is completely above an upper-most surface of the UBM layer, a lowest portion of the conductive pillar has curved sidewalls, the lowest portion is above a top surface of the passivation layer, and the conductive pillar comprises copper.

2. The semiconductor device of claim 1 wherein the under-bump-metallurgy (UBM) layer is between the contact pad and conductive pillar.

3. The semiconductor device of claim 2, wherein the under-bump-metallurgy (UBM) layer comprises
a first under-bump-metallurgy (UBM) sub-layer having a first width over the contact pad; and
a second under-bump-metallurgy (UBM) sub-layer having a second width over the first under-bump-metallurgy (UBM) sub-layer, wherein the second width is less than the first width.

4. The semiconductor device of claim 3, wherein a difference between the first width and second width is in the range of about 0.5 to 10 μm.

5. The semiconductor device of claim 3, wherein a ratio of the first width to the second width is from about 1.01 to 1.20.

6. The semiconductor device of claim 3, wherein a thickness of the second under-bump-metallurgy (UBM) sub-layer is in the range of about 4000 and 6000 angstroms.

7. The semiconductor device of claim 3, wherein a ratio of a thickness of the first under-bump-metallurgy (UBM) sub-layer to a thickness of the second under-bump-metallurgy (UBM) sub-layer is from about 0.15 to 0.25.

8. The semiconductor device of claim 3, wherein the upper portion of the conductive pillar has an outer edge substantially aligned with an outer edge of the first under-bump-metallurgy (UBM) sub-layer.

9. The semiconductor device of claim 3, wherein an outer edge of the second under-bump-metallurgy (UBM) sub-layer is substantially aligned with an inner edge of the lowest portion of the conductive pillar.

10. The semiconductor device of claim 3, wherein an outer edge of the second under-bump-metallurgy (UBM) sub-layer is between an outer edge of the lowest portion of the conductive pillar and an inner edge of the lowest portion of the conductive pillar.

11. The semiconductor device of claim 3, wherein the conductive pillar and the second under-bump-metallurgy (UBM) layer comprise the same material.

12. A semiconductor device comprising:
a substrate;
an inter-metal dielectric (IMD) layer over the substrate, the IMD layer having a top conductive layer;
an under bump metallurgy (UBM) layer electrically connected to the top conductive layer; and
a conductive pillar over the UBM layer, wherein sidewalls of the conductive pillar extending from a top portion to a bottom portion are perpendicular to a top surface of the substrate and a lowest portion of the conductive pillar having curved sidewalls, the lowest portion disposed over an uppermost surface of the UBM layer, and the conductive pillar comprises copper.

13. The semiconductor device of claim 12, wherein an outer surface of the lowest portion of the conductive pillar and a top surface of the UBM layer form an acute angle.

14. The semiconductor device of claim 12, further comprising a passivation layer formed between the UBM layer and the top conductive layer, the passivation layer defining an opening, the UBM layer is electrically connected to the top conductive layer in the opening.

15. The semiconductor device of claim 14, wherein a width of the opening is less than a width of the lowest portion of the conductive pillar.

16. The semiconductor device of claim 12, wherein the UBM layer comprises
a first UBM layer having a first width; and
a second UBM layer over the first UBM layer, the second UBM layer having a second width less than the first width.

17. An integrated circuit comprising:
a substrate having a plurality of microelectronic elements formed therein;
a contact pad over the substrate;
a under-bump-metallurgy (UBM) layer over the contact pad;
a passivation layer extending over the substrate and having an opening over the contact pad; and
a conductive pillar over the opening of the passivation layer, wherein a lowest portion of the conductive pillar has curved sidewalls, the lowest portion is above a top surface of the passivation layer, an entirety of a sidewall extending from a bottom-most surface of the conductive pillar to an upper-most surface of the conductive pillar is free from contact with the UBM layer, and the conductive pillar comprises copper.

18. The integrated circuit of claim 17, wherein the UBM layer comprises:
a first under-bump-metallurgy (UBM) layer having a first width over the contact pad; and
a second UBM layer having a second width over the first UBM layer, wherein the second width is less than the first width.

19. The integrated circuit of claim 18, wherein an outer edge of the second UBM layer is substantially aligned with an inner edge of the lowest portion of the conductive pillar.

20. The integrated circuit of claim 18, wherein an outer edge of the second UBM layer is between an outer edge of the lowest portion of the conductive pillar and an inner edge of the lowest portion of the conductive pillar.

* * * * *